United States Patent [19]

Hodapp

[11] Patent Number: 4,791,324
[45] Date of Patent: Dec. 13, 1988

[54] CMOS DIFFERENTIAL-AMPLIFIER SENSE AMPLIFIER

[75] Inventor: Stephen Hodapp, Austin, Tex.

[73] Assignee: Motorola, Inc., Schaumburg, Ill.

[21] Appl. No.: 36,626

[22] Filed: Apr. 10, 1987

[51] Int. Cl.[4] .................. G01R 19/00; G06G 7/12; G11C 7/02

[52] U.S. Cl. .................. 307/530; 307/490; 307/496; 307/497; 307/498; 365/207; 365/208

[58] Field of Search ........... 307/530, 364, 490, 496, 307/497, 498; 365/207, 208

[56] References Cited

U.S. PATENT DOCUMENTS

| | | | |
|---|---|---|---|
| 4,539,494 | 9/1985 | Kurafuji | 307/530 |
| 4,634,900 | 8/1986 | Koshizuka | 307/530 |
| 4,644,196 | 2/1987 | Flannagan | 307/530 |
| 4,644,197 | 2/1987 | Flannagan | 307/530 |
| 4,697,112 | 9/1987 | Ohtani et al. | 307/530 |

Primary Examiner—Stanley D. Miller
Assistant Examiner—Trong Quang Phan
Attorney, Agent, or Firm—John A. Fisher; Jeffrey Van Myers; James L. Clingan, Jr.

[57] ABSTRACT

A CMOS sense amplifier for use in a memory comprises two CMOS differential amplifiers. Each differential amplifier receives the same two signals generated from a selected bit line pair and each provides a different one of a complementary pair of signals. Each differential amplifier has a current mirror for loads. Each differential amplifier uses a transistor current source. A transistor will operate as a more ideal current source if it is in saturation. The transistor current source is biased by the current mirror of the differential amplifier of which it is a part. The resulting differential amplifier thus has a transistor current source which is biased closer to saturation than if biased by a normal clock signal which is either at the high or low power supply voltage. The self-biasing aspect avoids the problems associated with generating a special reference voltage for the differential amplifier.

10 Claims, 1 Drawing Sheet

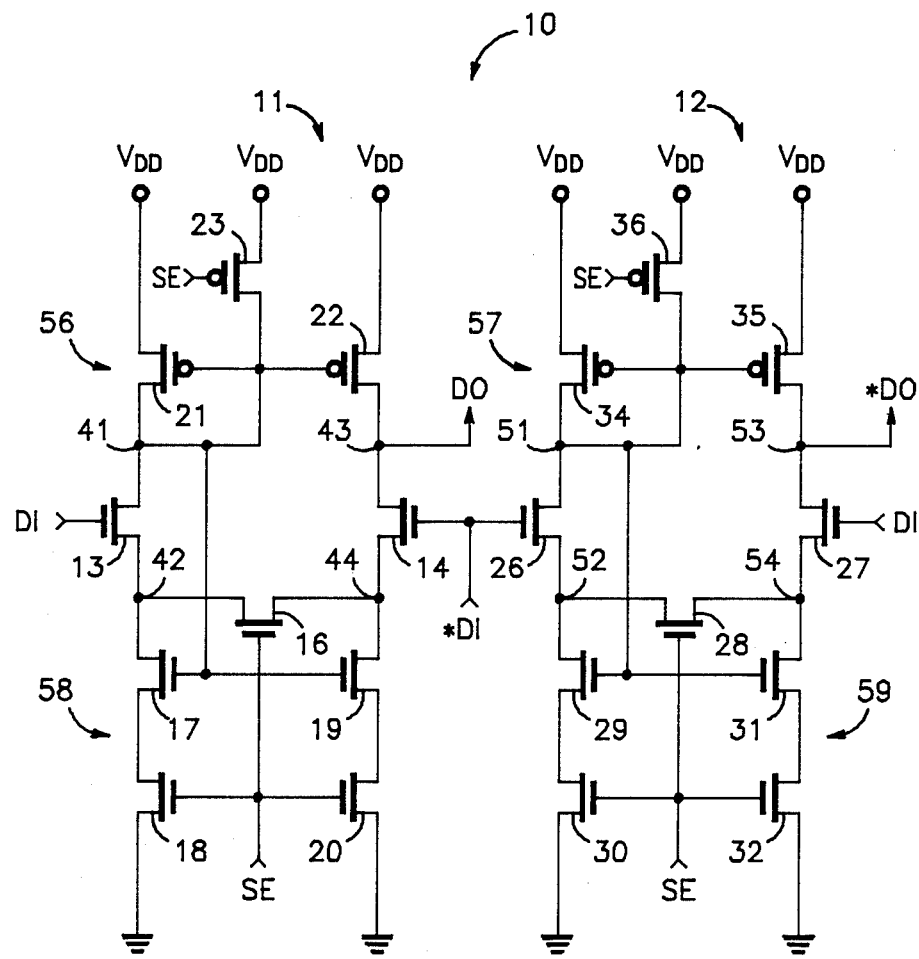

CMOS DIFFERENTIAL-AMPLIFIER SENSE AMPLIFIER

FIELD OF THE INVENTION

The present invention relates to sense amplifiers, and more particularly, to CMOS sense amplifiers which use differential-amplifier techniques.

BACKGROUND OF THE INVENTION

In an CMOS static random access memories (SRAMs) it has become common to use a differential amplifier. An example of such a sense amplifier is described in U.S. Pat. No. 4,644,196, Flannagan. One of the characteristics of a differential amplifier is a current source coupled to the sources of a pair of input insulated gate field effect transistors (IGFETs) which receive a pair of differential signals. In general it is considered ideal for the current through the current source to remain constant during amplification of the differential signal. In a CMOS differential amplifier, the current source is normally an IGFET which is enabled by a clock signal. An IGFET acts more like an ideal current source if it is in saturation as opposed to being in its triode region of operation. In order for the current source IGFET to be in saturation its gate to source voltage cannot exceed its threshold voltage by more than its drain to source voltage. As in the case of the above cited Flannagan patent, the current source IGFET generally receives a clock signal which is at or near the power supply voltage. Consequently, the gate to source voltage is at or near the power supply voltage whereas the drain to source voltage is much lower. The threshold voltage is normally less than a volt so that the gate to source voltage easily exceeds the threshold voltage by more than the magnitude of the drain to source voltage. One approach that has been used to cause the current source IGFET to be in saturation is to generate a reference voltage for application to the gate of the current source IGFET. The reference voltage is chosen to ensure that the current source IGFET is in saturation. This solution has some disadvantages which tradeoff with those associated with the approach which uses a standard clock signal. The reference voltage must be generated by a reference circuit which has a current drain associated with it. Additionally, the sense amplifier must have the ability to be tri-stated which may result in a clock signal additional to the reference voltage being required by the sense amplifier. The reference voltage must also be clocked at relatively high speed, which limits how low the current of the reference voltage generator can be.

SUMMARY OF THE INVENTION

An object of the present invention is to provide an improved sense amplifier.

Another object of the invention is to provide an improved differential-amplifier sense amplifier.

Yet another object of the invention is to provide a CMOS differential amplifier with an improved current source.

These and other objects are achieved in a sense amplifier having a voltage-controlled current source, a first current mirror load, a first transistor, and a second transistor. The first voltage-controlled current source has a control terminal, and first and second current terminals for flowing current therebetween. The second terminal is coupled to a first power supply terminal. The first current mirror load has a reference portion and a load portion. The reference portion is coupled to the control terminal of the first voltage-controlled current source. The load portion provides an output signal of the differential amplifier. The first transistor has a first current electrode coupled to the reference portion of the first current mirror, a control electrode coupled to a first input signal, and a second current electrode coupled to the first terminal of the first voltage-controlled current source. The second transistor has a first current electrode coupled to the load portion of the current mirror, a control electrode for receiving a second input signal, and a second current electrode coupled to the second current electrode of the first transistor.

BRIEF DESCRIPTION OF THE DRAWINGS

The sole FIGURE is a circuit diagram of a sense amplifier according to a preferred embodiment of the invention.

DESCRIPTION OF THE INVENTION

Shown in the FIGURE is a sense amplifier 10 comprised generally of a differential amplifier 11, and a differential amplifier 12 for amplifying a pair of differential input signals DI and *DI. Differential amplifier 11 comprises an N channel transistor 13, an N channel transistor 14, an N channel transistor 16, an N channel transistor 17, an N channel transistor 18, an N channel transistor 19, an N channel transistor 20, a P channel transistor 21, a P channel transistor 22, and a P channel transistor 23. Differential amplifier 12 comprises an N channel transistor 26, an N channel transistor 27, an N channel transistor 28, an N channel transistor 29, an N channel transistor 30, an N channel transistor 31, an N channel transistor 32, a P channel transistor 34, a P channel transistor 35, and a P channel transistor 36.

Transistor 13 has a gate for receiving signal DI, a drain connected to a node 41, and a source connected to a node 42. Transistor 14 has a gate for receiving signal *DI, a drain connected to a node 43, and a source connected to a node 44. Transistor 16 has a first current electrode connected to node 42, a second current electrode connected to node 44, and a control electrode for receiving a sense enable signal SE. Transistor 16 is utilized so that the drain and source functions of the frrst and second current electrodes are interchangeable. Transistor 17 has a gate connected to node 41, a drain connected to node 42, and a source. Transistor 18 has a drain connected to the source of transistor 17, a gate for receiving signal SE, and a source connected to ground which is used as a negative power supply terminal. Transistor 19 has a drain connected to node 44, a gate connected to node 41, and a source. Transistor 20 has a gate for receiving signal SE, a drain connected to the source of transistor 19, and a source connected to ground. Transistor 21 has a gate and a drain connected to node 41, and a source connected to a positive power supply terminal VDD for receiving a positive power supply voltage of, for example, 5 volts. Transistor 22 has a gate connected to node 41, a source connected to VDD, and a drain connected to node 43. An output signal DO of sense amplifier 10 is provided at node 43. Transistor 23 has a source connected to VDD, a gate for receiving a signal SE, and a drain connected to node 41.

Transistor 26 has a gate for receiving signal *DI, a drain connected to a node 51, and a source connected to a node 52. Transistor 27 has a gate for receiving signal DI, a drain connected to a node 53, and a source connected to a node 54. Transistor 28 has a first current electrode connected to node 52, a second current electrode connected to node 54, and a control electrode for receiving a sense enable signal SE. Transistor 29 has a gate connected to node 51, a drain connected to node 52, and a source. Transistor 30 has a drain connected to the source of transistor 29, a gate for receiving signal SE, and a source connected to ground. Transistor 31 has a drain connected to node 54, a gate connected to node 51, and a source. Transistor 32 has a gate for receiving signal SE, a drain connected to the source of transistor 31, and a source connected to ground. Transistor 34 has a gate and a drain connected to node 51, and a source connected to VDD. Transistor 35 has a gate connected to node 51, a source connected to VDD, and a drain connected to node 53. An output signal *DO of sense amplifier 10 is provided at node 53. Transistor 36 has a source connected to VDD, a gate for receiving a signal SE, and a drain connected to node 51.

Differential amplifier 11 provides signal DO as a function of the voltage difference between signals DI and *DI. Signals DI and *DI are received from a selected pair of bit lines of a memory. Signal DO is increased in voltage when signal DI is larger than signal *DI. Signal DO is decreased when signal *DI is greater than signal DI. Similarly, differential amplifier 12 provides signal *DO as a function of the voltage difference between signals DI and *DI. Signal *DO is increased when signal *DI is greater than signal DI and decreased when signal DI is greater than signal *DI. This is the conventional operation of a pair of differential amplifiers used as a sense amplifier. Transistors 21 and 22 form a current mirror 56 and are the loads for differential amplifier 11. This is also common for a CMOS differential amplifier. Similarly, transistors 34 and 35 form a current mirror 57 which forms the load for differential amplifier 12. Transistor 21 of current mirror 56 establishes a reference current which is mirrored to transistor 22 to establish a load current therethrough. Transistor 34 of current mirror 57 establishes a reference current which is mirrored to transistor 35 to establish a load current therethrough. This is conventional use of a current mirror in a differential amplifier. Another standard characteristic of differential amplifiers is a current source. The current source for differential amplifier 11 is obtained with the use of transistors 16–20. Transistor 16 is primarily a coupling device so that transistors 17–20 are considered to form a current source 58 for differential amplifier 11. Similarly, transistors 29–32 are considered to form a current source 59 for differential amplifier 12. To have a current source in a differential amplifier is conventional, but the particular current sources 58 and 59 of differential amplifiers 11 and 12 are novel.

Sense amplifier 10 has a tri-state mode and an amplify mode. The amplify mode is implemented by sense enable signal SE being a logic high. The tri-state mode is implemented by signal SE being a logic low. When signal SE is a logic low, transistors 23 and 36 are conductive and transistors 16, 18, 20, 28, 30 and 32 are non-conductive. With transistor 23 conductive, a logic high is coupled to the gates of transistors 21 and 22, causing transistors 21 and 22 to be non-conductive. Transistors 18 and 20 being non-conductive blocks the path to ground for transistors 13 and 14. Transistor 16 being non-conductive separates transistors 13 and 14 from each other. Signal DO is thus ensured of being a high impedance. Signal *DO is similarly ensured of being a high impedance. Signal SE can also be viewed as a disable signal which disables current mirrors 56 and 57 and current sources 58 and 59 when signal SE is a logic low.

When signal SE is a logic high, which places sense amplifier 10 in the amplify mode, transistors 23 and 36 are non-conductive so that current mirrors 56 and 57 operate as current mirror loads as is conventional for CMOS differential amplifiers. With signal SE at a logic high, transistors 16, 18, and 20 are made conductive to enable current source 58 and transistors 28, 30, and 32 to enable current source 59. In the amplify mode, transistors 17 and 19 have there drains coupled together via transistor 16 and their sources coupled to ground via transistors 18 and 20 which is another way of saying that transistor 17 is coupled to node 44 and ground, and transistor 19 is coupled to node 42 and ground. In the amplify mode, transistors 17 and 19 essentially operate as a single transistor which is coupled between the sources of transistors 13–14 and ground.

Transistors 17 and 19 primarily affect the current source characteristics of current source 58 and operate as a voltage-controlled current source. The gates of transistors 17 and 19 being connected to node 41 reduce the voltage applied thereto below VDD. The typical current source is an N channel transistor clocked by signal SE so that it is biased at VDD in the amplify mode. Node 41 on the other hand is below VDD so that transistors 17 and 19 are closer to saturation than if VDD were applied to the gates thereof. A transistor in saturation is very much closer to an ideal current source than is one in its triode region. This results in an improvement in the common mode rejection of differential amplifier 11 over the case in which the current source is simply driven by VDD. This also approaches the performance of the reference voltage approach with regard to common mode rejection.

The speed of differential amplifier 11 is significantly affected by the gain, and thus size, of transistors 13, 14, 21, and 22. For a given size of transistors 13, 14, 21, and 22, there will be less current because of transistors 17 and 20 being biased at less than VDD. It is undesirable to make transistors 17 and 19 more resistive by making them smaller. This is because a very small transistor has less predictable characteristics. Process variations cause a greater change in characteristics of a very small device than a larger device. Transistors 17 and 19 are thus made sufficiently large while also being higher resistance because of the reduced bias on the gates of these transistors. One effect of the increased resistance to the current source is reduced current for given device sizes of transistors 13, 14, 21, and 22. The reduced current produces increased gain in differential amplifier 11. The increased gain is caused by an increase in the drain to source resistance of transistors 21 and 22 which follows as a result of the reduced current. Transistors 13 and 14 also have an increase in drain to source resistance which also further increases the gain. Thus, many of the advantages of a transistor which has applied to its gate a reference voltage for the current source are present in the self-biased current source 58.

In addition to the inherent advantage of being self-biased which avoids the problems attendant with requiring a reference voltage, current source 58 provides for more AC gain. For example, in the case in which the signal DI is smaller than signal *DI, the reduction in voltage of signal DI will tend to decrease the current through transistor 13. This decrease in current through transistor 13 will decrease the current through transistor 21. The decrease in current through transistor 21 will decrease the voltage drop across transistor 21 so that the voltage on node 41 will increase. Because transistor 21 is in saturation, the voltage on node 41 will be related to the square root of the current through transistor 21. This increase in voltage on node 41 will increase the conductivity of transistors 17 and 19 so that more current will tend to be drawn by transistors 17 and 19 which has the beneficial effect of further decreasing the voltage of signal DO, the desired result. This beneficial effect is primarily for high speed operation. It has been found that the effect of the change in current source 58 due to a change in node 41 does not have a significant affect on the DC gain. High speed operation is, of course, very significant.

Sense amplifier 10 thus has substantially the same advantages of a reference driven current source with respect to current consumption, common mode rejection, and gain while having the advantage of being self-biasing as opposed to requiring a reference circuit. Sense amplifier 10 further has the advantage of more AC gain than the reference driven current source approach.

I claim:

1. A sense amplifier, comprising:
   a first voltage-controlled current source having a control terminal, and first and second current terminals for carrying current therebetween, said second current terminal coupled to a power supply terminal;
   a first current mirror load having a reference portion and a load portion, said reference portion coupled to the control terminal of the first voltage-controlled current source and said load portion for providing a first output signal of said sense amplifier;
   a first transistor having a first current electrode coupled to the reference portion of said first current mirror load, a control electrode coupled to a first input signal, and a second current electrode coupled to the first current terminal of the first voltage-controlled current source;
   a second transistor having a first current electrode coupled to the load portion of said first current mirror load, a control electrode for receiving a second input signal, and a second current electrode coupled to the second current electrode of the first transistor; and
   first disable means, coupled to the first current mirror load, for disabling the first current mirror load in response to a disable signal.

2. The sense amplifier of claim 1 further comprising:
   second disable means, interposed between the second terminal of the first voltage-controlled current source and said power supply terminal, for decoupling the second terminal of the first voltage-controlled current source from said power supply terminal in response to the disable signal.

3. The sense amplifier of claim 2 further comprising:
   third disable means, interposed between the second current electrodes of the first and second transistor, for decoupling the second current electrode of the first transistor from the second current electrode of the second transistor in response to the disable signal.

4. The sense amplifier of claim 3 further comprising:
   a second voltage-controlled current source having a control terminal, and first and second current terminals for carrying current therebetween, said second current terminal coupled to said power supply terminal;
   a second current mirror load having a reference portion and a load portion, said reference portion coupled to the control terminal of second voltage-controlled current source and said load portion for providing a second output signal of said sense amplifier;
   a third transistor having a first current electrode coupled to the reference portion of said second current mirror load, control electrode coupled for receiving the second input signal, and a second current electrode coupled to the first current terminal of the second voltage-controlled current source; and
   a fourth transistor having a first current electrode coupled to the load portion of said second current mirror load, a control electrode for receiving the first input signal, and a second current electrode coupled to the second current electrode of the third transistor.

5. The sense amplifier of claim 4 further comprising:
   fourth disable means, coupled to the second current mirror load, for disabling the second current mirror load in response to the disable signal.

6. The sense amplifier of claim 5 further comprising:
   fifth disable means, interposed between the second terminal of the second voltage-controlled current source and said power supply terminal, for decoupling the second terminal of the second voltage-controlled current source from said power supply terminal in response to the disable signal.

7. The sense amplifier of claim 6 further comprising:
   sixth disable means, interposed between the second current electrodes of the third and fourth transistors, for decoupling the second current electrode of the third transistor from the second current electrode of the fourth transistor in response to the disable signal.

8. The sense amplifier of claim 4 further comprising:
   a second voltage-controlled current source having a control terminal, and first and second current terminals for carrying current therebetween, said second current terminal coupled to said power supply terminal;
   a second current mirror load having a reference portion and a load portion, said reference portion coupled to the control terminal of said second voltage-controlled current source and said load portion for providing a second output signal of said sense amplifier;
   a third transistor having a first current electrode coupled to the reference portion of the second current mirror, a control electrode coupled for receiving the second input signal, and a second current electrode coupled to the first current terminal of the second voltage-controlled current source; and
   a fourth transistor having a first current electrode coupled to the load portion of said second current mirror load, a control electrode for receiving the first input signal, and a second current electrode coupled to the first terminal of the second voltage-controlled current source.

9. A sense amplifier, comprising:
   a first transistor of the first conductivity type having a first current electrode coupled to a first power supply terminal, and a control electrode and a second current electrode coupled to a first node;

a second transistor of a second conductivity type having a first current electrode coupled to the first node, a control electrode for receiving a first input signal, and a second current electrode;

a third transistor of the second conductivity type having a first current electrode coupled to the second current electrode of the second transistor, a control electrode coupled to the first node, and a second current electrode;

a fourth transistor of the second conductivity type having a first current electrode coupled to the second current electrode of the third transistor, a control electrode for receiving an enable signal, and a second current electrode coupled to a second power supply terminal;

a fifth transistor of the first conductivity type having a first current electrode coupled to the first power supply terminal, a control electrode coupled to the first node, and a second current electrode for providing a first output signal;

a sixth transistor of the second conductivity type having a first current electrode coupled to the second current electrode of the fifth transistor, a control electrode for receiving a second input signal, and a second current electrode;

a seventh transistor of the second conductivity type having a first current electrode coupled to the second current electrode of the sixth transistor, a control electrode coupled to the first node, and a second current electrode;

an eighth transistor of the second conductivity type having a first current electrode coupled to the second current electrode of the seventh transistor, a control electrode for receiving the enable signal, and a second current electrode coupled to the second power supply terminal;

a ninth transistor of the second conductivity type having a first current electrode coupled to the second current electrode of the second transistor, a second current electrode coupled to the second current electrode of the sixth transistor, and a control electrode for receiving the enable signal; and a tenth transistor of the first conductivity type having a first current electrode coupled to the first power supply terminal, a second current electrode coupled to the first node, and a control electrode for receiving the enable signal.

10. A sense amplifier, comprising:

an eleventh transistor of the first conductivity type having a first current electrode coupled to a first power supply terminal, and a control electrode and a second current electrode coupled to a second node;

a twelfth transistor of the second conductivity type having a first current electrode coupled to the second node, a control electrode for receiving the second input signal, and a second current electrode;

a thirteenth transistor of the second conductivity type having a first current electrode coupled to the second current electrode of the twelfth transistor, a control electrode coupled to the second node, and a second current electrode;

a fourteenth transistor of the second conductivity type having a first current electrode coupled to the second current electrode of the thirteenth transistor, a control electrode for receiving the enable signal, and a second current electrode coupled to the second power supply terminal;

a fifteenth transistor of the first conductivity type having a first current electrode coupled to the first power supply terminal, a control electrode coupled to the second node, and a second current electrode for providing a second output signal;

a sixteenth transistor of the second conductivity type having a first current electrode coupled to the second current electrode of the fifteenth transistor, a control electrode for receiving the first input signal, and a second current electrode;

a seventeenth transistor of the second conductivity type having a first current electrode coupled to the second current electrode of the sixteenth transistor, a control electrode coupled to the second node, and a second current electrode;

an eighteenth transistor of the second conductivity type having a first current electrode coupled to the second current electrode of the seventeenth transistor, a control electrode for receiving the enable signal, and a second current electrode coupled to the second power supply terminal;

a nineteenth transistor of the second conductivity type having a first current electrode coupled to the second current electrode of the twelfth transistor, a second current electrode coupled to the second current electrode of the sixteenth transistor, and a control electrode for receiving the enable signal; and a twentieth transistor of the first conductivity type having a first current electrode coupled to the first power supply terminal, a second current electrode coupled to the second node, and a control electrode for receiving the enable signal.

* * * * *

UNITED STATES PATENT AND TRADEMARK OFFICE
CERTIFICATE OF CORRECTION

PATENT NO. : 4,791,324

DATED : December 13, 1988

INVENTOR(S) : Stephen Hodapp

It is certified that error appears in the above-identified patent and that said Letters Patent is hereby corrected as shown below:

Column 6, line 14, insert --a-- before "control".

Column 6, line 42, change "4" to --1--.

Signed and Sealed this

Twenty-ninth Day of August, 1989

Attest:

DONALD J. QUIGG

*Attesting Officer*  *Commissioner of Patents and Trademarks*